(12) United States Patent
Kim

(10) Patent No.: US 6,458,692 B1
(45) Date of Patent: Oct. 1, 2002

(54) METHOD OF FORMING CONTACT PLUG OF SEMICONDUCTOR DEVICE

(75) Inventor: Tae-heon Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/080,939

(22) Filed: Feb. 22, 2002

(30) Foreign Application Priority Data

May 22, 2001 (KR) ......................................... 2001-28090

(51) Int. Cl.⁷ .......................................... H01L 21/4763
(52) U.S. Cl. ......................... 438/639; 438/672; 438/745
(58) Field of Search ................................ 438/622, 629, 438/637, 639, 640, 672, 745, 746

(56) References Cited

U.S. PATENT DOCUMENTS

| | | | | |
|---|---|---|---|---|
| 5,500,080 A | * | 3/1996 | Choi | 156/644.1 |
| 6,110,773 A | * | 8/2000 | Lee | 438/238 |
| 6,214,715 B1 | * | 4/2001 | Huang et al. | 438/597 |
| 6,344,391 B1 | * | 2/2002 | Lee et al. | 438/253 |
| 6,365,504 B1 | * | 4/2002 | Chien et al. | 438/624 |
| 2001/0046737 A1 | * | 11/2001 | Ahn et al. | 438/253 |

* cited by examiner

Primary Examiner—T. N. Quach
(74) Attorney, Agent, or Firm—Mills & Onello LLP

(57) ABSTRACT

A method of forming contact plugs of a semiconductor device is provided. Bit lines are formed over a semiconductor substrate in which a predetermined lower layer is formed and a cell area and a core area are defined. An interlayer dielectric layer is formed over the semiconductor substrate over which the bit lines are formed. The interlayer dielectric layer is wet etched until the interlayer dielectric layer is recessed from the upper surfaces of the bit lines to a predetermined depth. A dielectric layer for forming spacers is formed over the semiconductor substrate, the dielectric layer having a step difference formed due to the wet etching of the interlayer dielectric layer. The dielectric layer in the core area is left and the dielectric layer in the cell area is etched by an anisotropic method to form spacers of the dielectric layer in the cell area. The interlayer dielectric layer is etched using the spacers and the dielectric layer as a mask to form contact holes. A conductive layer is deposited over the semiconductor substrate where the contact holes are formed to fill the contact holes.

18 Claims, 6 Drawing Sheets

METHOD OF FORMING CONTACT PLUG OF SEMICONDUCTOR DEVICE

BACKGROUND OF THE INVENTION

1. Field of the Invention

The present invention relates to a method of manufacturing a semiconductor device, and more particularly, to a method of forming contact plugs of a semiconductor device.

2. Description of the Related Art

As techniques for manufacturing semiconductor devices develop and the applications for memory devices expand, memory devices having large capacity have been developed. In particular, a memory cell is typically composed of one capacitor and one transistor, and thus dynamic random access memories (DRAMs) are advantageous in that their integration density has been remarkably improved.

As the integration density of semiconductor devices increases, the size of contact holes decreases, but the thickness of interlayer dielectric layers increases. Thus, the aspect ratio of the contact holes, i.e., the ratio of a hole's length to its diameter, increases and an arrangement margin of the contact holes decreases in a photolithography process. Thus, it is difficult to manufacture semiconductor devices. As a result, a technique for forming contact pads is widely used. Moreover, a technique for forming self-aligned contact pads has been proposed as a technique for forming contact pads appropriate for realizing grand-scale integrated semiconductor devices.

An increase in the capacitance of capacitors used in semiconductor devices is also required, and thus, a structure in which capacitors are formed over bit lines, i.e., a capacitor-over bit line (COB) structure, has been adopted. However, as the integration density of semiconductor devices increases, when forming a buried contact, such as a contact formed underneath a storage electrode of the capacitor and connected to the storage electrode and a source of a transistor, the buried contact may be electrically short-circuited with a bit line formed underneath the capacitor. In order to prevent such a short-circuit, a dielectric margin of an interlayer dielectric layer insulating the bit line must be ensured. That is, the size of the contact must decrease. However, the amount of reduction in the size of the contact is restricted due to the limitations of the photolithography process used in creating the device.

FIGS. 1 through 5 are cross-sectional views showing steps of forming contact plugs of a semiconductor device according to the prior art. Referring to FIG. 1, a cell area A and a core area B are defined in a semiconductor substrate 100. Field oxide layers (not shown), which electrically isolate active regions from each of the cell area A and the core area B, are formed. The field oxide layers may be formed by a common local oxidation of silicon (LOCOS) method or a shallow trench isolation (STI) process.

Transistors having source regions (not shown), drain regions (not shown), and gate electrodes (not shown) are formed in the cell area A and the core area B. The gate electrodes include gate oxide layers, gate conductive layers, and capping dielectric layers, and spacers are formed on the sidewalls of the gate electrodes. The source and drain regions have a lightly doped drain (LDD) structure.

A first interlayer dielectric layer 102 is deposited over the resultant structure and is then planarized by chemical mechanical polishing (CMP) or etch back. The first interlayer dielectric layer 102 is patterned to form contact pads 104 which are electrically connected to the source/drain regions. A conductive layer is deposited to fully fill the first interlayer dielectric layer 102 and is then planarized by CMP. Node-separation is made by the planarization process, and thus, the contact plugs 104 are formed over the source/drain regions.

A second interlayer dielectric layer 106 is formed over the resultant structure and is then planarized by CMP or etch back. Contact holes penetrating the second interlayer dielectric layer 106 are formed using a common photolithography process or an etching process and are then filled with a conductive material, thereby forming contact plugs (not shown) for connecting bit lines and the drain regions. The contact plugs are connected to the contact pads 104 over the drain regions.

Bit lines 112 are formed on the second interlayer dielectric layer 106. The bit lines 112 are connected to the contact plugs. The bit lines 112 have a structure in which conductive layers 108 and capping dielectric layers 110 are sequentially stacked. The capping dielectric layers 110 are formed of silicon nitride.

A silicon nitride layer is deposited over the resultant structure and is then etched by an anisotropic method, thereby forming spacers 114 on the sidewalls of the bit lines 112.

Referring to FIG. 2, a third interlayer dielectric layer 116 is deposited over the resultant structure. As the integration density of semiconductor devices increases, the width between the bit lines 112 is reduced and the aspect ratio of the bit lines 112 is increased. In the case of increasing the aspect ratio, voids occur at the entrance of a gap between the bit lines 112. Then, adjacent conductive layers are short-circuited, and thus, the semiconductor device does not operate normally. In order to solve this problem, the entrance of the gap is widened by a wet etching and then a fourth interlayer dielectric layer 118 is deposited as shown in FIG. 3. The deposited interlayer dielectric layer 118 is planarized by CMP or etch back.

Referring to FIG. 4, a photoresist pattern 120 is formed using a photolithography process to form contact holes for electrically connecting a storage electrode (not shown) and source regions. The fourth interlayer dielectric layer 118, a third interlayer dielectric layer 116a, and the second interlayer dielectric layer 106 are sequentially dry-etched using the photoresist pattern 120 as a mask, thereby forming contact holes 112. However, the capping dielectric layers 110 and the spacers 114 are also removed during the dry etching. As a result, the conductive layers 108 of the bit lines 112 are exposed. Then, the conductive layers 108 are electrically short-circuited with contact plugs (124 of FIG. 5), and thus, the semiconductor device does not operate normally. Only the fourth, third, and second interlayer dielectric layers 118, 116a, and 106 are selectively etched using an etching gas having an excellent etch selectivity to a silicon nitride layer, but the silicon nitride layer is also etched at a predetermined ratio during the etching process. Thus, upper portions of the capping dielectric layers 110 and the spacers 114 are etched. As a result, the conductive layers 108 are exposed. This phenomenon becomes more serious as the contact holes 122 become deeper. In FIG. 4, dotted lines denote portions where the capping dielectric layers 110 and the spacers 114 are removed during the etching process for forming the contact holes 122.

Referring to FIG. 5, the photoresist pattern 120 is removed. A polysilicon layer, which is doped with ions, is deposited over the resultant structure to fully fill the contact holes 122 and is then planarized by CMP or etch back.

Contact plugs 124, which are node-separated, are formed due to the planarization process. However, as described previously, conductive layers 108a and contact plugs 124 are contacted, and thus, may be electrically short-circuited if the conductive layers 108a are exposed. Also, a capping dielectric layer 110a in the core area B is entirely consumed due to dishing during the planarization process for node-separating and thus, the conductive layer 108a may be exposed. In FIG. 5, dotted lines denote portions where the capping dielectric layer 110a and spacers 114a in the core area B are removed.

SUMMARY OF THE INVENTION

To solve the above-described problems, it is an object of the present invention to provide a method of forming contact plugs of a semiconductor device which can effectively remove voids due to the deposition of interlayer dielectric layers, reduce parasitic capacitance, and prevent conductive layers of bit lines from being exposed when etching the interlayer dielectric layers to form contact holes or prevent a conductive layer of a bit line in a core area from being exposed due to dishing during a planarization process for forming contact plugs.

In accordance with the invention, there is provided a method of forming contact plugs of a semiconductor device. Bit lines are formed over a semiconductor substrate in which a predetermined lower layer is formed and a cell area and a core area are defined. An interlayer dielectric layer is formed over the semiconductor substrate over which the bit lines are formed. The interlayer dielectric layer is wet etched until the interlayer dielectric layer is recessed from the upper surfaces of the bit lines to a predetermined depth. A dielectric layer for forming spacers is formed over the semiconductor substrate, the dielectric layer having a step difference formed due to the wet etching of the interlayer dielectric layer. The dielectric layer in the core area is left and the dielectric layer in the cell area is etched by an anisotropic method to form spacers of the dielectric layer in the cell area. The interlayer dielectric layer is etched using the spacers and the dielectric layer as a mask to form contact holes. A conductive layer is deposited over the semiconductor substrate where the contact holes are formed to fill the contact holes.

The step of forming the bit lines can include depositing conductive layers over the semiconductor substrate, depositing capping dielectric layers on the conductive layers and sequentially etching the capping dielectric layers and the conductive layers.

In one embodiment, a surface of the interlayer dielectric layer remaining after wet etching the interlayer dielectric layer is higher than the conductive layers and is lower than the entire height of the conductive layers and the capping dielectric layers.

The capping dielectric layers can be silicon nitride layers.

The dielectric layer for forming spacers can also be a silicon nitride layer.

In one embodiment, the step of forming the spacers includes coating the dielectric layer for forming spacers with photoresist and then protecting the entire core area with the photoresist and forming a photoresist pattern for forming contact holes in the cell area. The dielectric layer can be etched by an anisotropic method using the photoresist pattern as a mask. The dielectric layer remaining at the bottom between the spacers can be etched, and the photoresist in the core area and the photoresist pattern in the cell area can then be removed.

After filling the contact holes with the conductive layer, the semiconductor substrate on which the conductive layer is deposited may be planarized by CMP or etch back to form contact plugs. It is preferable that the planarization be performed until an upper surface of the interlayer dielectric layer formed between bit lines in the cell area is exposed.

It is preferable that the interlayer dielectric layer is formed of borophosphosilicate glass (BPSG), phosphosilicate glass (PSG), spin-on glass (SOG), tetra ethyl ortho silicate (TEOS), undoped silicate glass (USG), or high density plasma (HDP).

In accordance with another aspect of the invention, there is provided another method of forming contact plugs of a semiconductor device. A field oxide layer defining an active area and a non-active area is formed on a semiconductor substrate in which a cell area and a core area are defined. A transistor having source regions, drain regions, and gate electrodes is formed on the semiconductor substrate. A first interlayer dielectric layer is formed over the semiconductor substrate on which the transistor is formed. Contact pads are formed over the source and drain regions in the semiconductor substrate. A second interlayer dielectric layer is formed over the semiconductor substrate in which the contact pads are formed. Contact plugs connected to the contact pads connected to the drain regions are formed. Bit lines connected to the contact plugs are formed on the second interlayer dielectric layer. A third dielectric layer is formed over the semiconductor substrate where the bit lines are formed. The third interlayer dielectric layer is wet etched until the third dielectric layer is recessed from the upper surfaces of the bit lines to a predetermined depth. A dielectric layer for forming spacers is formed over the semiconductor substrate, the dielectric layer having a step difference formed by the wet etching of the third interlayer dielectric layer. The dielectric layer in the core area is left and the dielectric layer in the cell area is etched by an anisotropic method to form spacers of the dielectric layer in the cell area. The third and second interlayer dielectric layers are etched using the spacers and the dielectric layer as a mask until the contact pads are exposed to form contact holes. A conductive layer is deposited over the semiconductor substrate in which the contact holes are formed to fill the contact holes.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
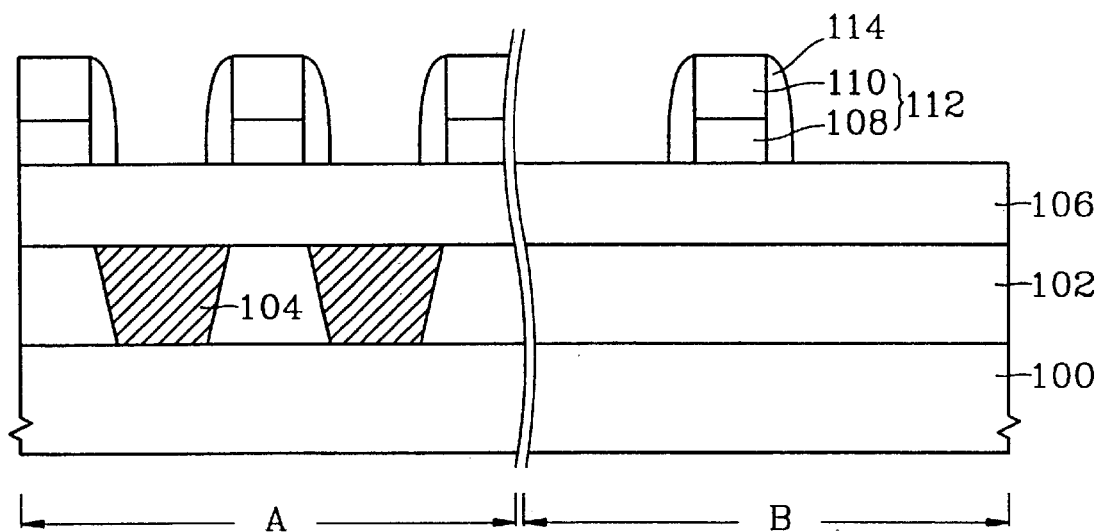
FIGS. 1 through 5 are cross-sectional views illustrating the steps of forming contact plugs of a semiconductor device according to the prior art.
Figure 2:
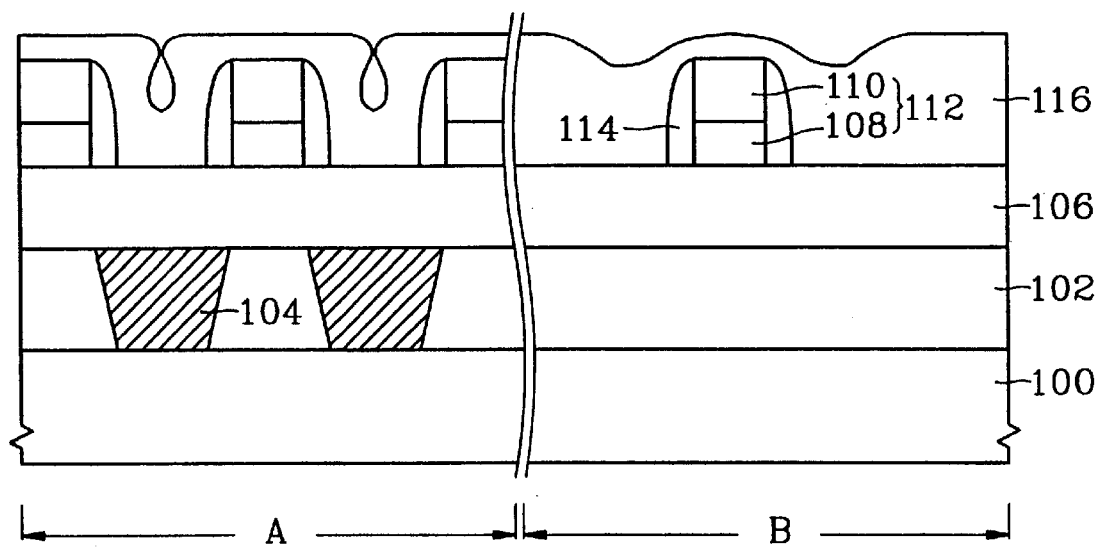
Figure 3:
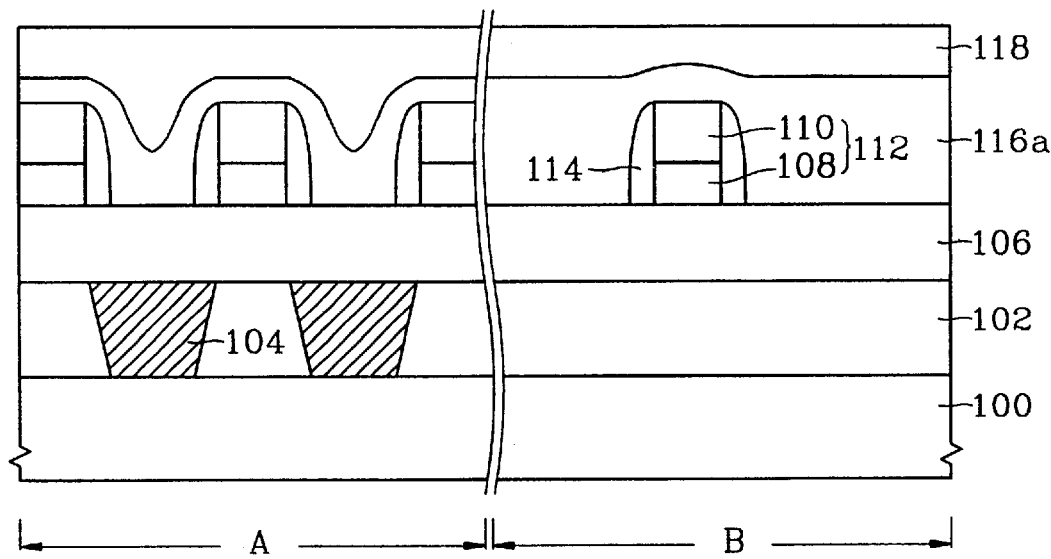
Figure 4:
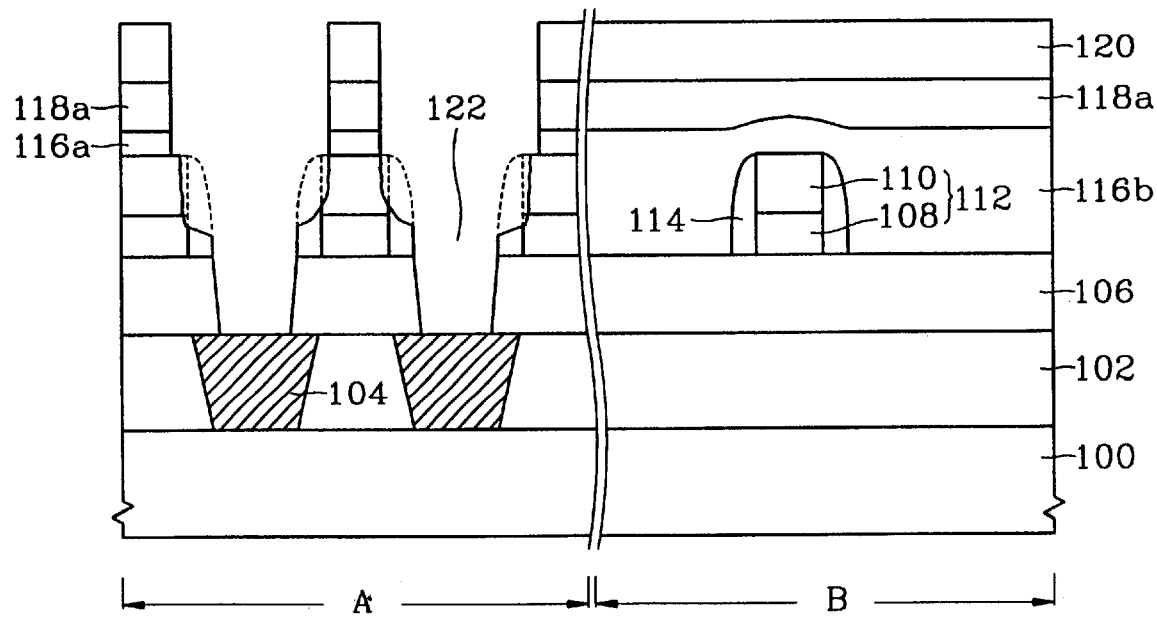
Figure 5:
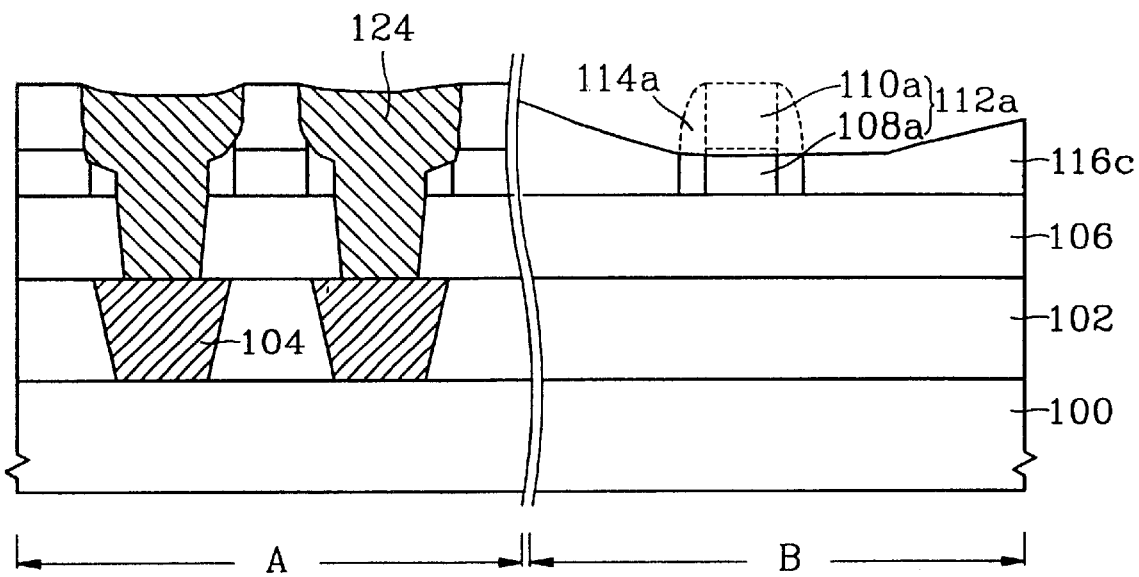

Hereinafter, embodiments of the present invention will be described in detail with reference to the attached drawings. However, the embodiments of the present invention can be modified into various other forms, and the scope of the present invention must not be interpreted as being restricted to the embodiments. In the drawings, the thicknesses of layers or regions are exaggerated for clarity. Also, when it is written that a layer is formed "on" another layer or a substrate, the layer can be formed directly on the other layer or the substrate, or other layers can intervene therebetween.

Figure 6:
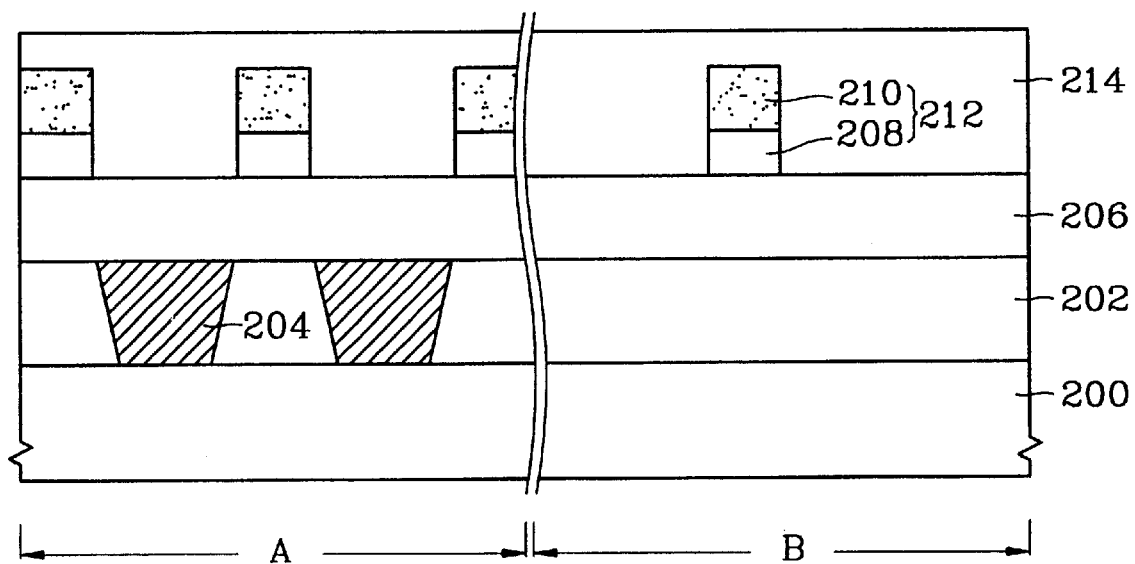
FIGS. 6 through 12 are cross-sectional views illustrating steps of forming contact plugs of a semiconductor device according to a preferred embodiment of the present invention.

FIGS. 6 through 12 show steps of forming contact plugs of a semiconductor device according to a preferred embodiment of the present invention. Referring to FIG. 6, a cell area A and a core area B are defined in a semiconductor substrate 200. Field oxide layers (not shown), which electrically isolate active regions from each of the cell area A and the core area B, are formed. The field oxide layers may be formed by a common LOCOS process or STI process.

Transistors having source regions (not shown), drain regions (not shown), and gate electrodes (not shown) are formed in the cell area A and the core area B. That is, a gate oxide layer, a material for gate conductive layers, and a material for capping dielectric layers are sequentially deposited and are then etched, thereby forming gate electrodes having capping dielectric layers, gate conductive layers, and gate oxide layers. Lightly dense impurity ions are implanted into active regions at both sides of the gate electrodes to form a lightly doped drain (LDD) structure. Spacers are formed on sidewalls of the gate electrodes and then high density impurity ions are implanted into active regions at both sides of the spacers, thereby forming source and drain regions having a LDD structure.

A first interlayer dielectric layer 202 is deposited over the resultant structure and is then planarized by CMP or etch back. The first interlayer dielectric layer 202 is preferably formed of borophosphosilicate glass (BPSG), phosphosilicate glass (PSG), spin-on glass (SOG), tetra ethyl ortho silicate (TEOS), undoped silicate glass (USG), or high density plasma (HDP).

The first interlayer dielectric layer 202 is patterned to form contact pads 204 which are electrically connected to the source/drain regions. A conductive layer is deposited to fully fill the first interlayer dielectric layer 202 and is then planarized. Node separation is achieved by the planarization process, thereby forming the contact pads 204 which are connected to the source/drain regions.

A second interlayer dielectric layer 206 is formed over the resultant structure and is then planarized by CMP or etch back. The second interlayer dielectric layer 206 is formed of a material having a high etch selectivity with respect to silicon nitride. It is preferable that the second interlayer dielectric layer 206 be formed of borophosphosilicate glass (BPSG), phosphosilicate glass (PSG), spin-on glass (SOG), tetra ethyl ortho silicate (TEOS), undoped silicate glass (USG), or high density plasma (HDP).

Contact holes (not shown), which penetrate the second interlayer dielectric layer 206, are formed by a common photolithography process or etching process and are then filled with a conductive material, thereby forming contact plugs (not shown) for electrically connecting bit lines and drain regions. The contact plugs are connected to the contact pads 204 formed over the drain regions.

Bit lines 212 are formed on the second interlayer dielectric layer 206. A conductive layer and a capping dielectric layer are sequentially stacked on the second interlayer dielectric layer 206 and are then etched, thereby forming the bit lines 212. The bit lines 212 are connected to the contact plugs. The bit lines 212 have a structure in which conductive layers 208 and capping dielectric layers 210 are sequentially stacked. It is preferable that the conductive layers 208 be formed of tungsten, tungsten silicide, or polycide. The capping dielectric layers 210 are formed of silicon nitride.

A third interlayer dielectric layer 214 is formed over the resultant structure and is then planarized by CMP or etch back. The third interlayer dielectric layer 214 is formed of a material having an excellent etch selectivity with respect to silicon nitride and having a lower dielectric constant than silicon nitride. The third interlayer dielectric layer 214 is preferably formed of boron phosphorous silicate glass (BPSG), phosphorous silicate glass (PSG), spin-on glass (SOG), tetra ethyl ortho silicate (TEOS), undoped silicate glass (USG), or high density plasma (HDP).

Figure 7:
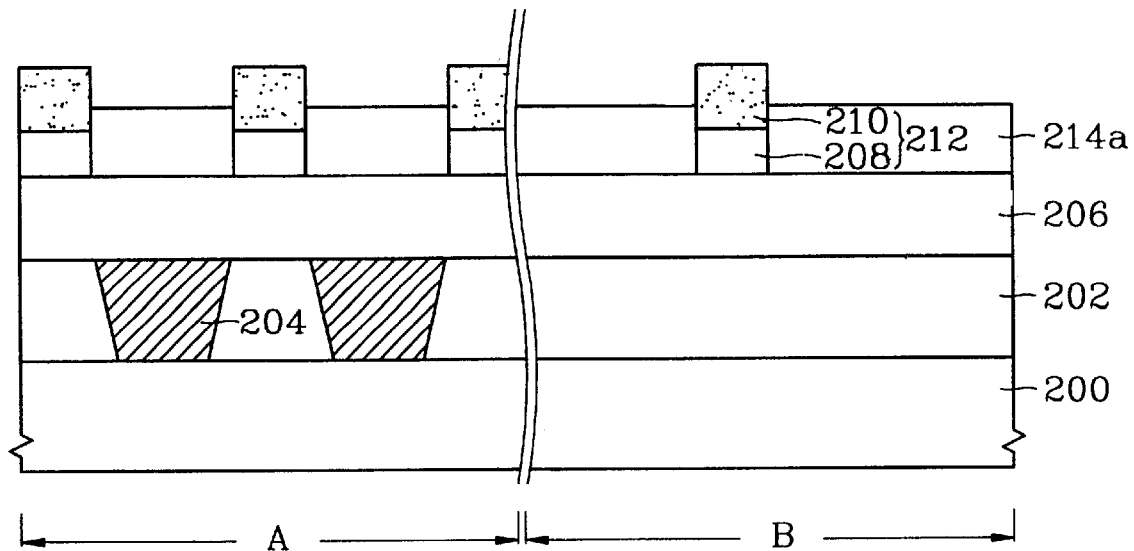

Referring to FIG. 7, the third interlayer dielectric layer 214 is wet-etched to a predetermined thickness. The wet etching is performed until the third interlayer dielectric layer 214 is recessed from the upper surfaces of the capping dielectric layers 210 to a predetermined depth. As a result, a third interlayer dielectric layer 214a remaining after the wet etching is higher than the conductive layers 208, but is lower than the height of the entire bit lines 212 (the height of the conductive layers 208 and the capping dielectric layers 210). Thus, even if voids are formed at the entrance of gaps between the bit lines 212 when depositing the third dielectric layer 214, voids inside the third interlayer dielectric layer 214 may be removed by the wet etching.

Figure 8:
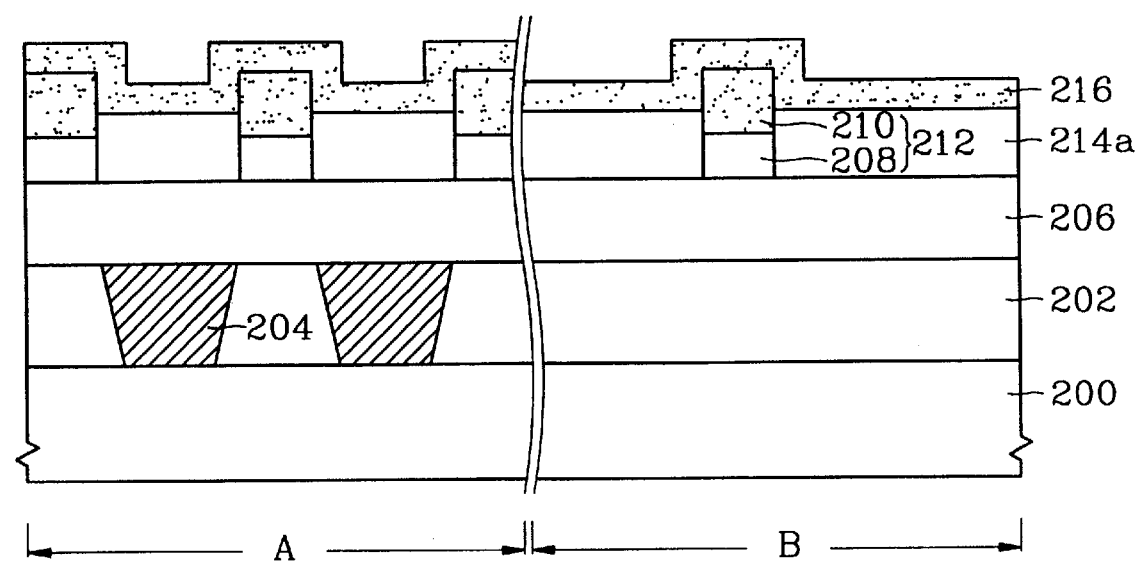
Figure 9:
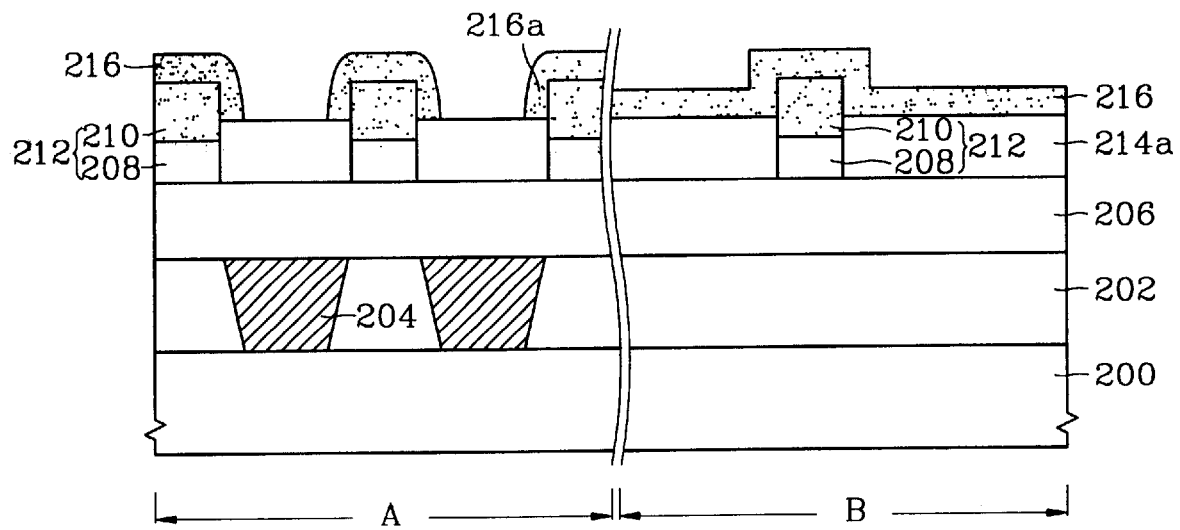

Referring to FIG. 8, a dielectric layer 216 is deposited over the resultant structure to form spacers (216a shown in FIG. 9). It is preferable that the dielectric layer 216 be formed of a material having a high etch selectivity with respect to the third interlayer dielectric layer 214a and the second interlayer dielectric layer 206, e.g., silicon nitride.

Referring to FIG. 9, the resultant structure is coated with a photoresist (not shown). A photoresist pattern (not shown) is formed in the cell area A using an exposure and development process to form spacers 216a of the dielectric layer 216. Here, the core area B is entirely protected by the photoresist in an etching process for forming the spacers 216a. The dielectric layer 216 is etched by an anisotropic method using the photoresist pattern as a mask, thereby forming the spacers 216a in the cell area A. The dielectric layer remaining at the bottom between the spacers 216 is also etched until the third interlayer dielectric layer 214a is exposed. The photoresist in the core area B and the photoresist pattern in the cell area A are removed. As in the embodiment of the present invention, the depth of the interlayer dielectric layers 214a and 206 to be etched to form contact holes (218 shown in FIG. 10) is considerably reduced compared with the prior art if the spacers 216a are formed. Conventionally, capping dielectric layers and the upper surfaces of spacers are etched in an etching process for forming contact holes, and thus, conductive layers of bit lines are exposed. However, in the case of the present invention, the thickness of the capping dielectric layers 210 is sufficient due to the dielectric layer 216, and thus, the conductive layers 208 of the bit lines are not exposed in the etching process for forming contact holes (See 218 shown in FIG. 10).

Figure 10:
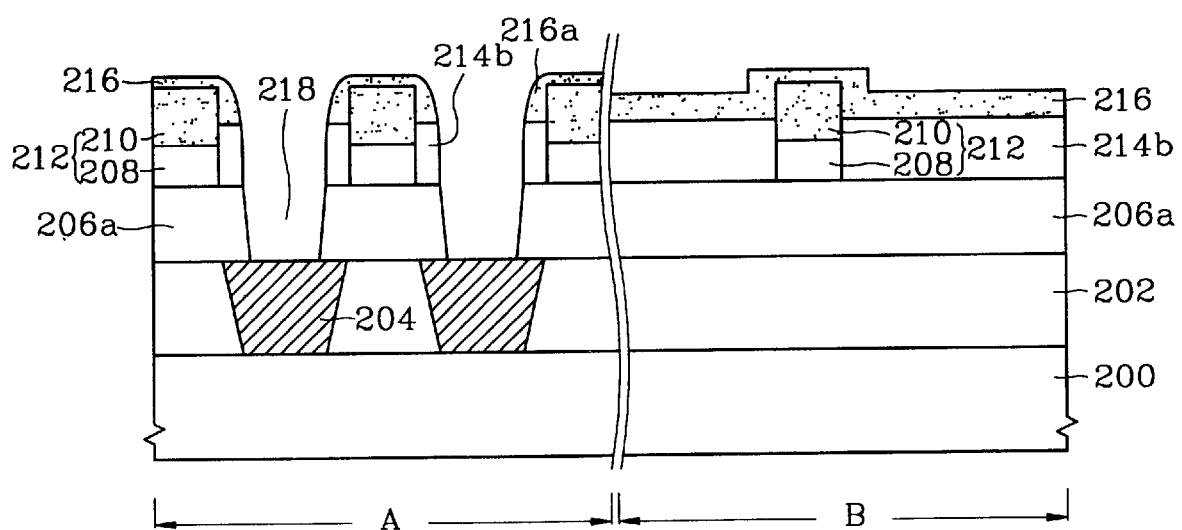

Referring to FIG. 10, the third interlayer dielectric layer 214a and the second interlayer dielectric layer 206 are dry etched using the spacers 216a and the dielectric layer 216 as a mask, thereby forming contact holes 218. Dry etching is performed until the contact pads 204 are exposed. Here, a gas having a high etch selectivity of the interlayer dielectric layers 214a and 206 with respect to silicon nitride is used as an etch gas. As described previously, in the case of the present invention, the depth of the interlayer dielectric layers 214a and 206 to be etched to form the contact holes 218 is considerably reduced compared with the prior art. Also, the capping dielectric layers 210 are thick enough to be used as a mask in the etching process for forming the contact holes 218. Thus, in the prior art, there are problems in that contact holes are not sufficiently opened, or conductive layers of bit lines are exposed when etching interlayer dielectric layers for forming the contact holes. However, in the present invention, such problems do not occur.

Figure 11:
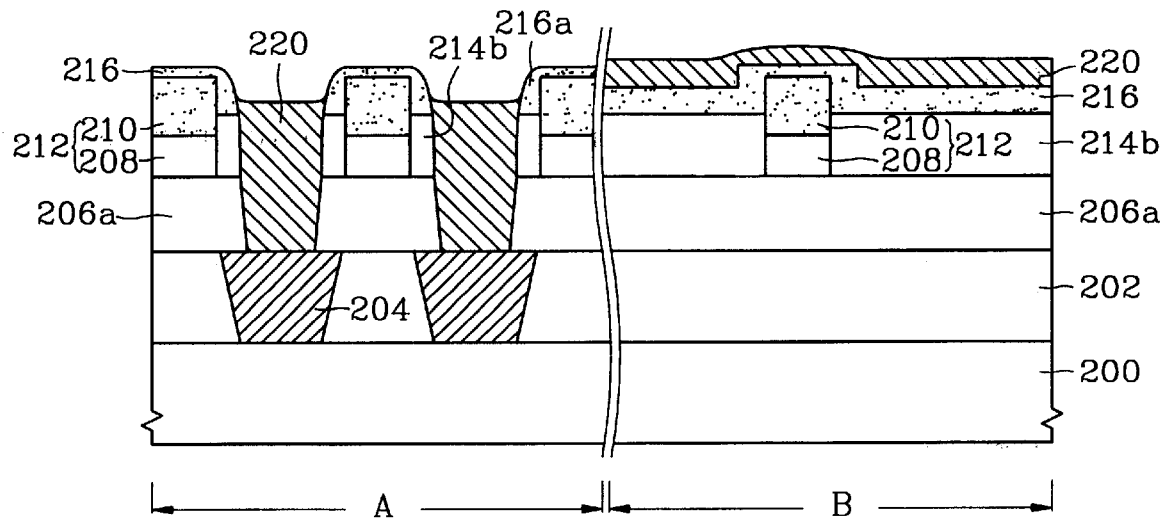

Referring to FIG. 11, a conductive layer is deposited over the resultant structure to fill the contact holes 218. The conductive layer may be doped polysilicon or metal.

Figure 12:
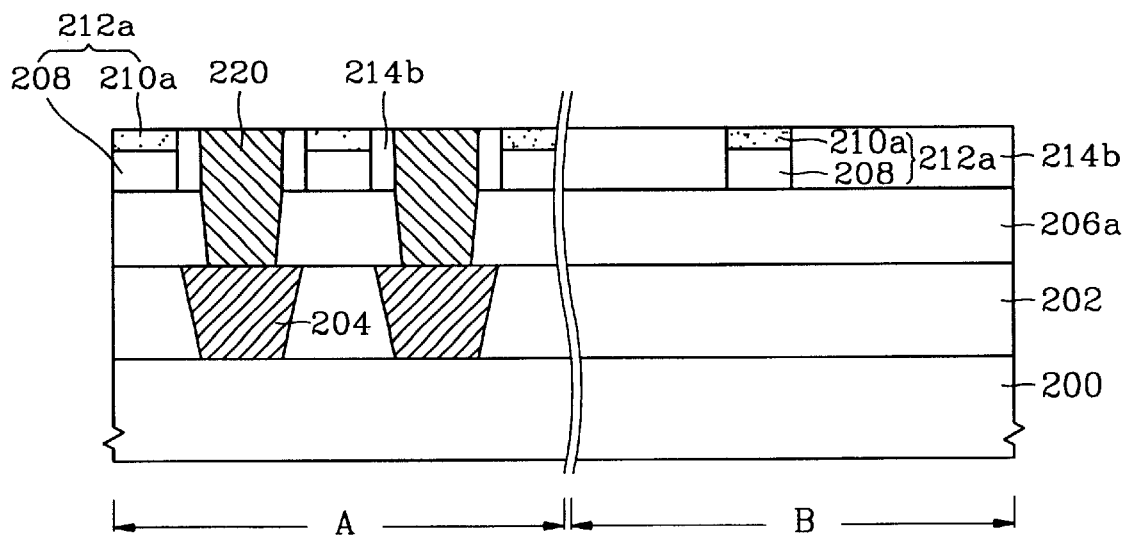

Referring to FIG. 12, the entire resultant structure is planarized by CMP or etch back for node separation. Contact plugs 220, which are node-separated by the planarization process, are formed. In the prior art, bit lines have spacers formed of silicon nitride layers after a planarization process for node separation. However, in the present invention, bit lines have spacers formed of oxide layers (or a third interlayer dielectric layer 214b). Thus, capacitance between a bit line 212 and another bit line 212 or between a conductive layer 208 of the bit line 212 and a contact plug 220 is reduced. That is, since the dielectric constant of the oxide layers 214b is lower than the dielectric constant of the silicon nitride layers, parasitic capacitance between the conductive layer 208 of the bit line 212 and the contact plug 220 is decreased. Also, in the prior art, capping dielectric layers of bit lines in a core area are all consumed due to dishing in a planarization process for node separation, and thus, conductive layers of the bit lines are exposed. However, in the present invention, a dielectric layer for forming spacers and a conductive layer for filling contact holes are formed in a core area to a thickness which is great enough so that conductive layers of bit lines are not exposed in a planarization process for node separation. Thus, the problem in the prior art does not occur.

According to a method of forming contact plugs of a semiconductor device of the present invention, even if voids occur at the entrance of gaps between bit lines when depositing interlayer dielectric layers, voids can be effectively removed by wet etching the interlayer dielectric layers. Parasitic capacitance between bit lines or between a conductive layer of a bit line and a contact plug can be reduced. Also, the depth of the interlayer dielectric layers to be etched to form contact holes is considerably reduced compared with the prior art, and the thickness of capping dielectric layers is sufficient due to a dielectric layer for forming spacers. Thus, in the prior art, there are problems in that the contact holes are insufficiently opened, or conductive layers of bit lines are exposed when etching the interlayer dielectric layers for forming the contact holes. However, in the present invention, such problems do not occur. Also, in the prior art, capping dielectric layers of bit lines in a core area are all consumed due to dishing in a planarization process for node separation, and thus, conductive layers of the bit lines in the core area are exposed. However, in the present invention, a dielectric layer for forming spacers and a conductive layer for filling contact holes are formed to a sufficient thickness in a core area before a planarization process, and thus, conductive layers of bit lines are not exposed in the planarization process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming contact plugs of a semiconductor device comprising:

forming bit lines over a semiconductor substrate in which a predetermined lower layer is formed and a cell area and a core area are defined;

forming an interlayer dielectric layer over the semiconductor substrate over which the bit lines are formed;

wet etching the interlayer dielectric layer until the interlayer dielectric layer is recessed from the upper surfaces of the bit lines to a predetermined depth;

forming a dielectric layer for forming spacers over the semiconductor substrate, the dielectric layer having a step difference formed due to the wet etching of the interlayer dielectric layer;

leaving the dielectric layer in the core area and etching the dielectric layer in the cell area by an anisotropic method to form spacers of the dielectric layer in the cell area;

etching the interlayer dielectric layer using the spacers and the dielectric layer as a mask to form contact holes; and depositing a conductive layer over the semiconductor substrate where the contact holes are formed to fill the contact holes.

2. The method of claim 1, wherein forming the bit lines comprises:

depositing conductive layers over the semiconductor substrate;

depositing capping dielectric layers on the conductive layers; and sequentially etching the capping dielectric layers and the conductive layers.

3. The method of claim 2, wherein a surface of the interlayer dielectric layer remaining after wet etching the interlayer dielectric layer is higher than the conductive layers and is lower than the entire height of the conductive layers and the capping dielectric layers.

4. The method of claim 2, wherein the capping dielectric layers are silicon nitride layers.

5. The method of claim 1, wherein the dielectric layer for forming spacers is a silicon nitride layer.

6. The method of claim 1, wherein forming the spacers comprises:

coating the dielectric layer for forming spacers with photoresist and then protecting the entire core area with the photoresist and forming a photoresist pattern for forming contact holes in the cell area;

etching the dielectric layer by an anisotropic method using the photoresist pattern as a mask;

etching the dielectric layer remaining at the bottom between the spacers; and removing the photoresist in the core area and the photoresist pattern in the cell area.

7. The method of claim 1, further comprising, after filling the contact holes with the conductive layer, planarizing the semiconductor substrate on which the conductive layer is deposited by one of CMP and etch back to form contact plugs.

8. The method of claim 7, wherein the planarization is performed until an upper surface of the interlayer dielectric layer formed between bit lines in the cell area is exposed.

9. The method of claim 1, wherein the interlayer dielectric layer is formed of one of borophosphosilicate glass (BPSG), phosphosilicate glass (PSG), spin-on glass (SOG), tetra ethyl ortho silicate (TEOS), undoped silicate glass (USG), and high density plasma (HDP).

10. A method of forming contact plugs of a semiconductor device comprising:

forming a field oxide layer defining an active area and a non-active area on a semiconductor substrate in which a cell area and a core area are defined;

forming a transistor having source regions, drain regions, and gate electrodes;

forming a first interlayer dielectric layer over the semiconductor substrate on which the transistor is formed;

forming contact pads over the source and drain regions in the semiconductor substrate;

forming a second interlayer dielectric layer over the semiconductor substrate in which the contact pads are formed;

forming contact plugs connected to the contact pads;

forming bit lines connected to the contact plugs on the second interlayer dielectric layer;

forming a third dielectric layer over the semiconductor substrate where the bit lines are formed;

wet etching the third interlayer dielectric layer until the third dielectric layer is recessed from the upper surfaces of the bit lines to a predetermined depth;

forming a dielectric layer for forming spacers over the semiconductor substrate, the dielectric layer having a step difference formed by the wet etching of the third interlayer dielectric layer;

leaving the dielectric layer in the core area and etching the dielectric layer in the cell area by an anisotropic method to form spacers of the dielectric layer in the cell area;

etching the third and second interlayer dielectric layers using the spacers and the dielectric layer as a mask until the contact pads are exposed to form contact holes; and depositing a conductive layer over the semiconductor substrate in which the contact holes are formed to fill the contact holes.

11. The method of claim 10, wherein forming the bit lines comprises:

depositing conductive layers on the second interlayer dielectric layer;

depositing capping dielectric layers on the conductive layers; and sequentially etching the capping dielectric layers and the conductive layers.

12. The method of claim 11, wherein a surface of the third interlayer dielectric layer remaining after wet etching the third interlayer dielectric layer is higher than the conductive layers and is lower than the entire height of the capping dielectric layers and the conductive layers.

13. The method of claim 11, wherein the capping dielectric layers are silicon nitride layers.

14. The method of claim 10, wherein the dielectric layer for forming spacers is a silicon nitride layer.

15. The method of claim 10, wherein forming the spacers comprises:

coating the dielectric layer for forming spacers with photoresist and then protecting the entire core area with the photoresist and forming a photoresist pattern for forming contact holes in the cell area;

etching the dielectric layer in the cell area by an anisotropic method using the photoresist pattern as a mask;

etching the dielectric layer remaining at the bottom between the spacers; and removing the photoresist in the core area and the photoresist pattern in the cell area.

16. The method of claim 10, further comprising, after filling the contact holes with the conductive layer, planarizing the semiconductor substrate where the conductive layer is deposited by one of CMP and etch back to form contact plugs.

17. The method of claim 16, wherein planarization is performed until the upper surface of the third interlayer dielectric layer is exposed between the bit lines in the cell area.

18. The method of claim 10, wherein the third interlayer dielectric layer is formed of one of borophosphosilicate glass (BPSG), phosphosilicate glass (PSG), spin-on glass (SOG), tetra ethyl ortho silicate (TEOS), undoped silicate glass (USG), and high density plasma (HDP).

* * * * *